(12) United States Patent
Chen

(10) Patent No.: US 6,531,927 B1
(45) Date of Patent: Mar. 11, 2003

(54) METHOD TO MAKE A PHASE-LOCKED LOOP'S JITTER TRANSFER FUNCTION INDEPENDENT OF DATA TRANSITION DENSITY

(75) Inventor: Dao-Long Chen, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/677,623

(22) Filed: Oct. 3, 2000

(51) Int. Cl.$^7$ ............................................. H03L 7/089
(52) U.S. Cl. ....................... 331/25; 331/14; 331/1 A; 327/156; 327/157; 327/159; 375/371; 375/373; 375/374; 375/375; 375/376; 713/400
(58) Field of Search ........................... 331/14, 1 A, 25; 327/156, 157, 159; 375/371, 373, 374, 375, 376; 713/400

(56) References Cited

U.S. PATENT DOCUMENTS 5,987,085 A * 11/1999 Anderson .................... 375/374

* cited by examiner

*Primary Examiner*—Arnold Kinkead
(74) *Attorney, Agent, or Firm*—Suiter & Associates PC

(57) ABSTRACT

The present invention discloses a novel method and apparatus for making a jitter transfer function of a phase-locked loop independent from the data transition density. The present invention is further discloses a phase-locked loop which has a loop bandwidth and a loop gain in the passband which are both independent from the received data patterns. By making the loop bandwidth independent of the received data pattern, the noise filtering performance of the phase-locked loop may be optimized.

12 Claims, 6 Drawing Sheets

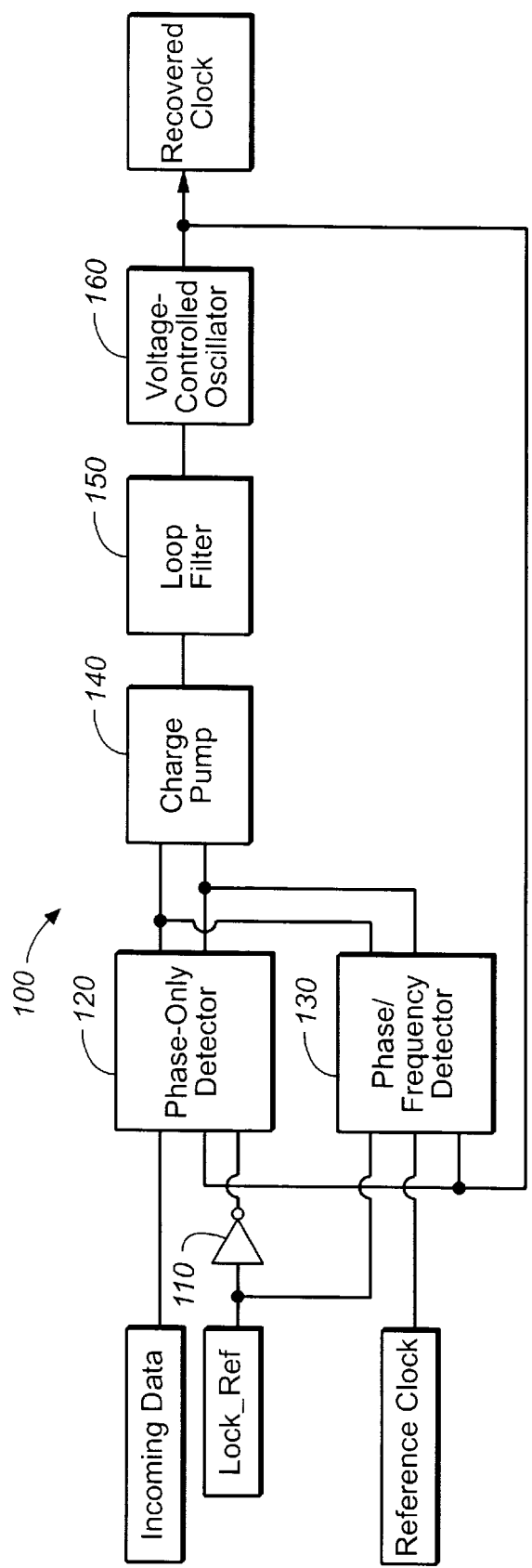
FIG._1
(PRIOR ART)

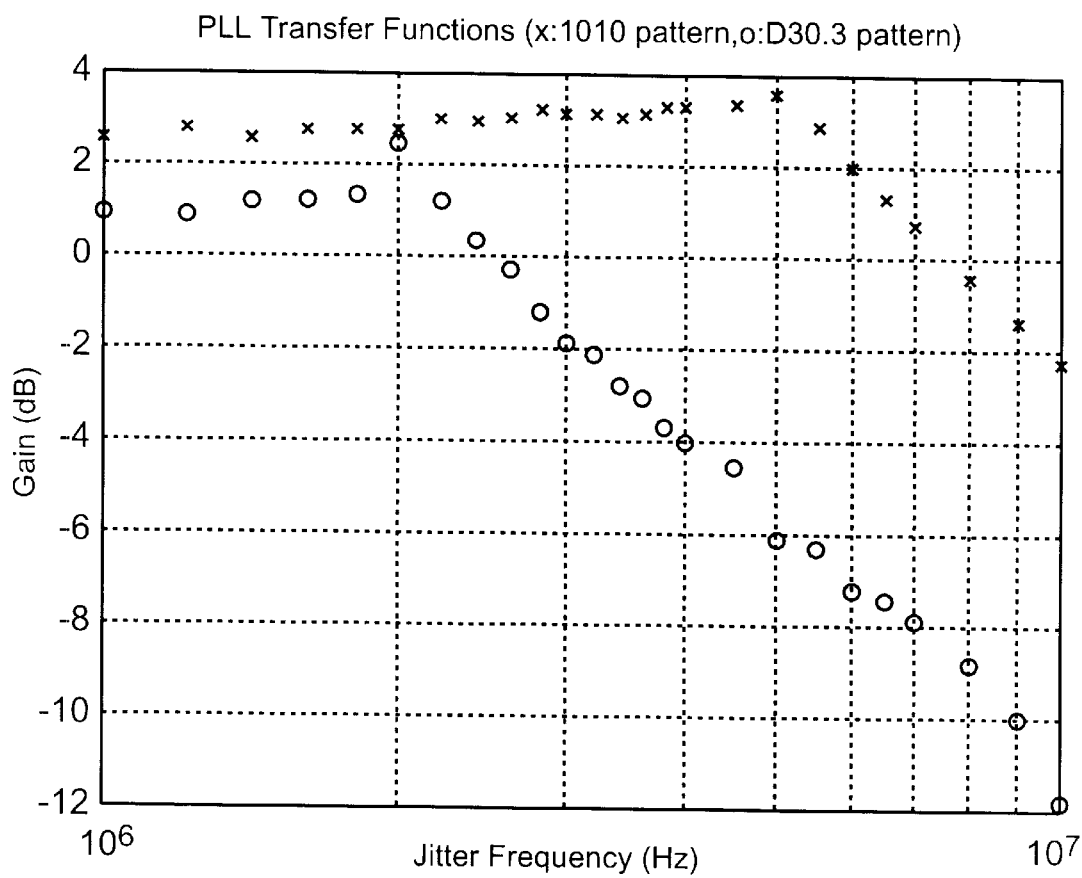
FIG._2
*(PRIOR ART)*

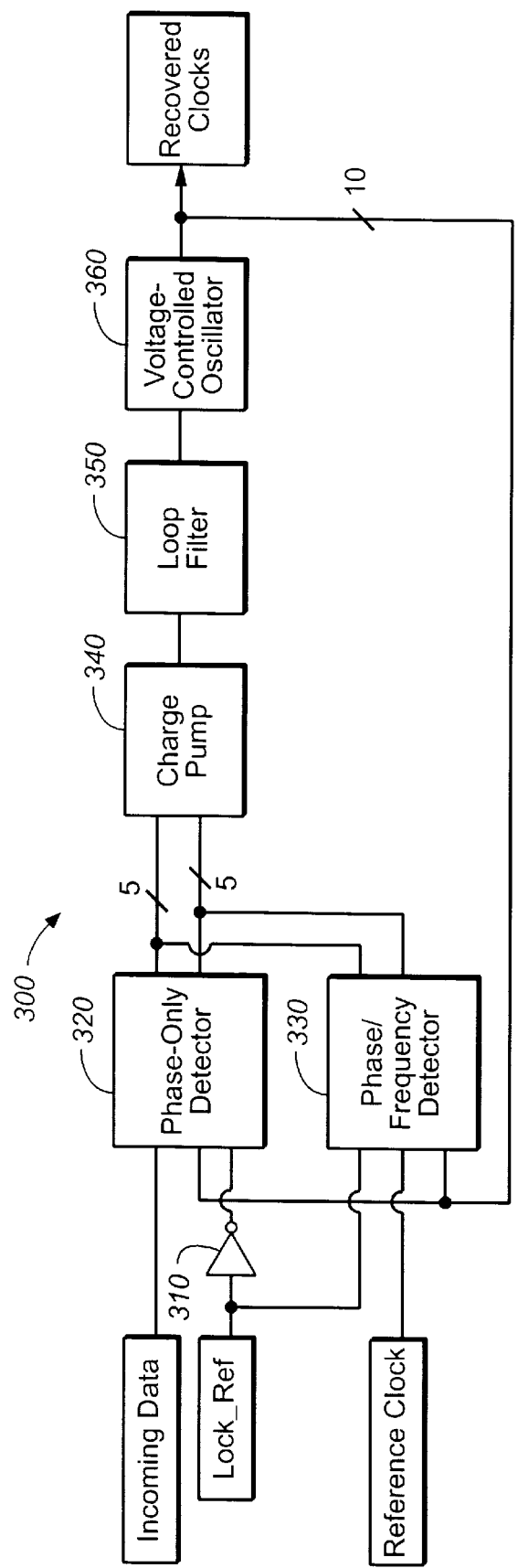
FIG._3

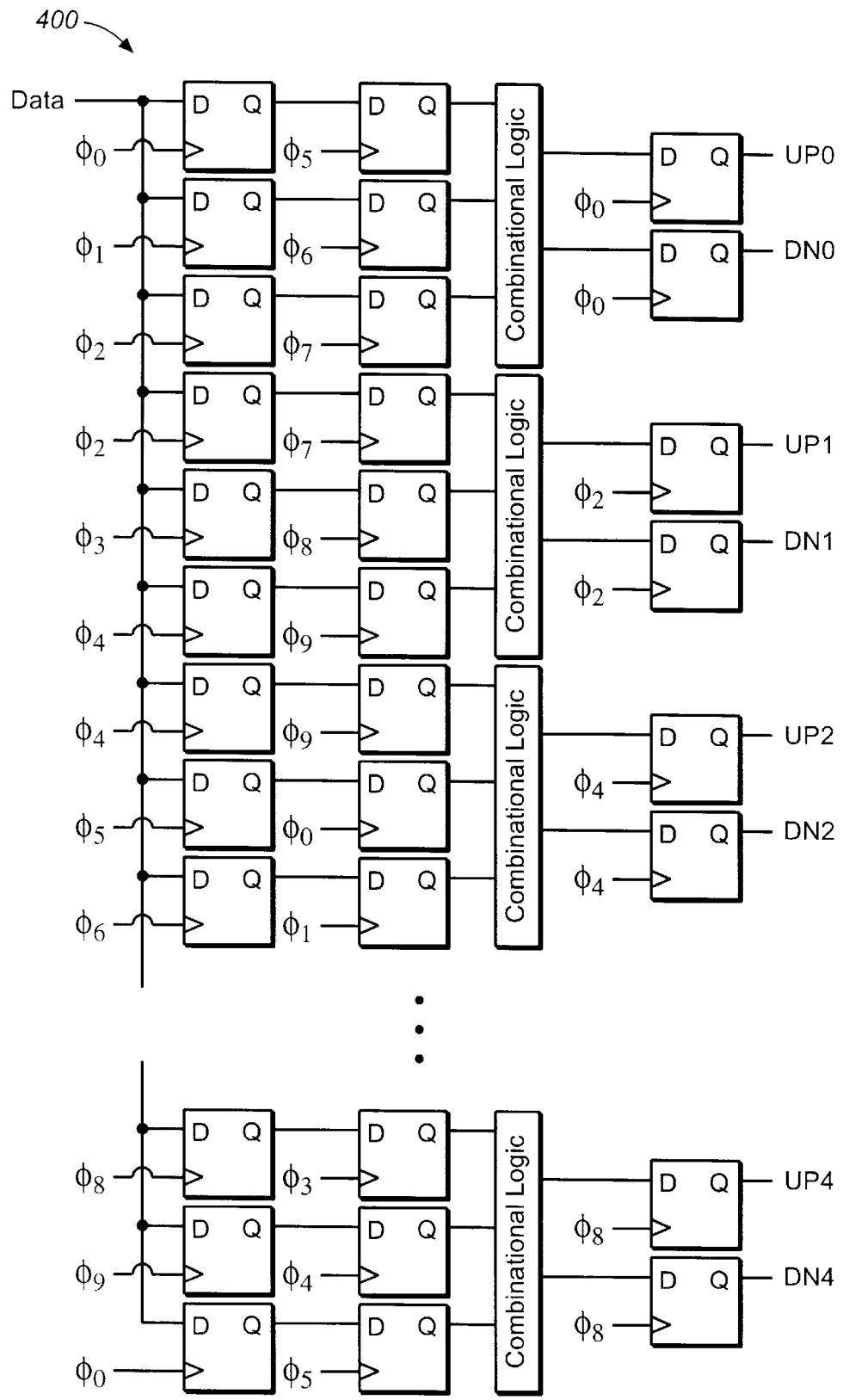
FIG._4 *(PRIOR ART)*

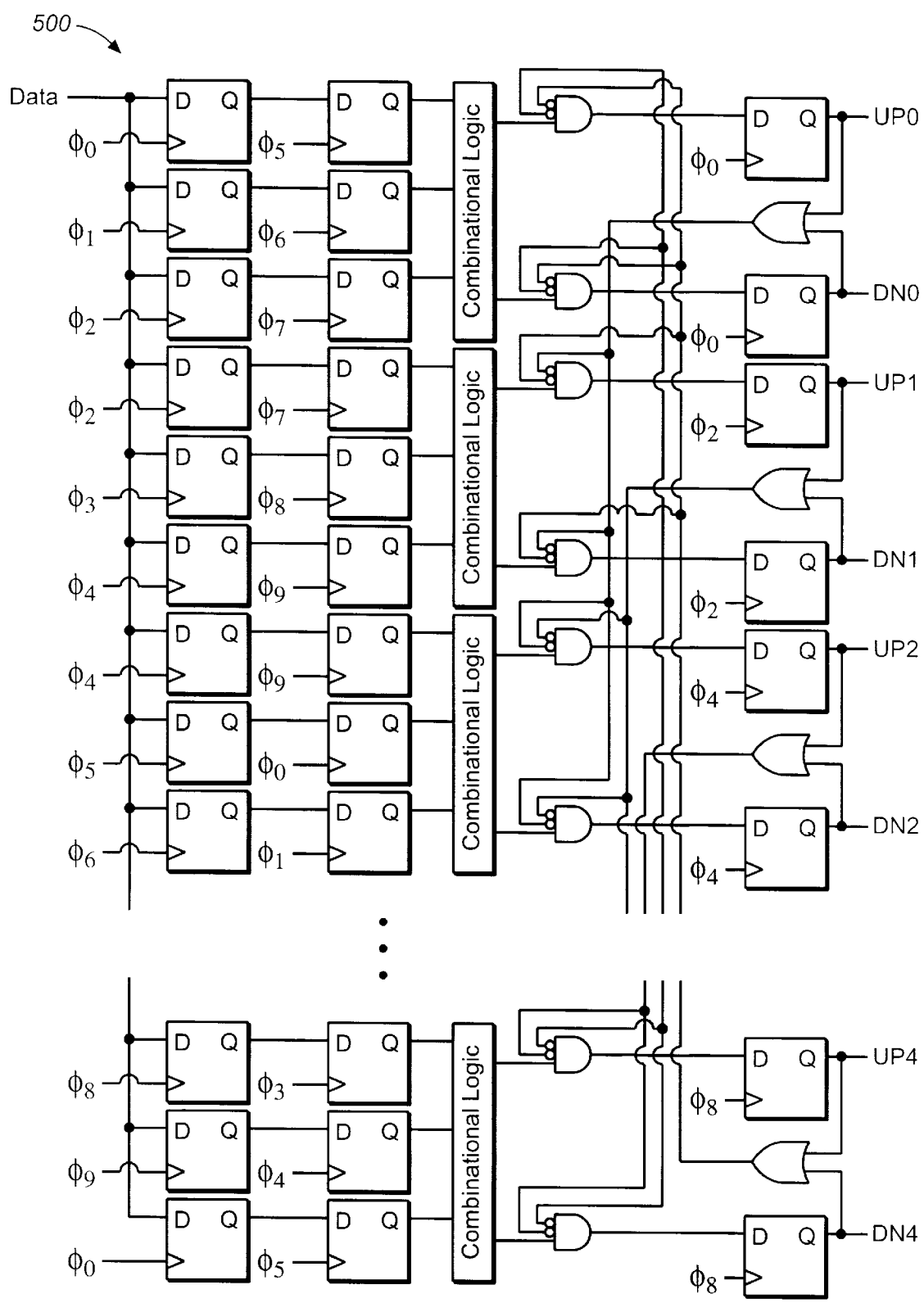
FIG._5

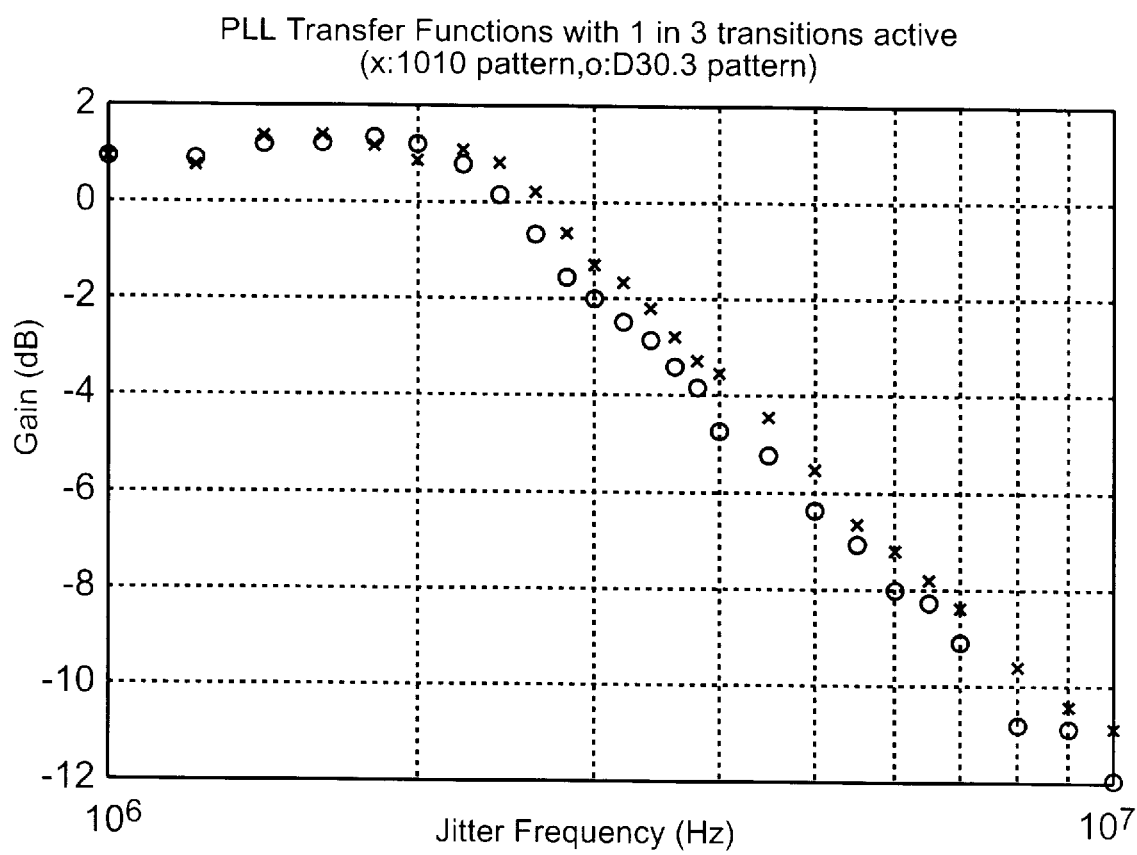
FIG._6

METHOD TO MAKE A PHASE-LOCKED LOOP'S JITTER TRANSFER FUNCTION INDEPENDENT OF DATA TRANSITION DENSITY

FIELD OF THE INVENTION

The present invention relates generally to phase-locked loops and more specifically to an apparatus and method of making phase-locked loop's jitter transfer function independent of data transition density.

BACKGROUND OF THE INVENTION

In order to improve the input/output performance of computer systems and networks, serial interface standards have been proposed and developed. In order to accommodate the serial interface standards, clock recovery circuitry has been developed to recover an embedded clock signal from the incoming data stream. A popular type of clock recovery circuit utilizes a phase-locked loop.

A type of measurement for phase-locked loop performance is the jitter transfer function. The jitter transfer function relates the ratio between the input jitter and output jitter in a specified frequency band. In phase-locked loop clock recovery circuits known to the art, the jitter transfer function is dependent upon the loop filter transfer function and the data transition density. Another factor in the performance of a phase-locked loop is the loop bandwidth. The loop bandwidth is also affected by the data transition density. This makes it difficult to optimize the jitter performance of a phase-locked loop with regard to its noise filtering capability since the loop bandwidth may change with a data pattern change.

The data transition density also affects the loop gain in non-linear phase-locked loops in the passband. This results in the static phase error, a measure of the amount of phase error when there is no noise, being dependent upon transition density. The static phase error affects the jitter performance of a phase-locked loop to a small degree at data rates of a gigabyte per second but greatly affects jitter performance at data rates of five gigabytes per second and higher.

Consequently, it would be advantageous if a method and apparatus existed that allowed a phase-locked loop's jitter transfer function to be independent of data transition density. It would also be advantageous if a phase-locked loop existed which allowed for an optimization in noise filtering performance by making the loop bandwidth independent of the received data patterns. Further, it would be advantageous if a phase-locked loop existed which allowed for a loop gain in the passband independent of the received data patterns. These advantages may be important as complementary metal oxide semiconductor (CMOS) technology moves into the multi-gigabits per second range and higher.

SUMMARY OF THE INVENTION

Accordingly, the present invention is directed to a novel method and apparatus for making a jitter transfer function of a phase-locked loop independent from the data transition density. The present invention is further directed to a phase-locked loop that has a loop bandwidth and a loop gain in the passband which are both independent from the received data patterns.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 1 depicts an embodiment of a phase-locked loop;

FIG. 2 depicts an exemplary graph which shows the gain versus the jitter frequency in a phase-locked loop known to the art;

FIG. 3 depicts an alternative embodiment of a phase-locked loop of the present invention;

FIG. 4 depicts an embodiment of a phase-only detector for a phase-locked loop known to the art;

FIG. 5 depicts an embodiment of a phase-only detector of the present invention; and FIG. 6 depicts an exemplary graph which shows the gain versus the jitter frequency in a phase-locked loop in accordance with the present invention.

DETAILED DESCRIPTION OF THE INVENTION

Reference will now be made in detail to an embodiment of the invention, examples of which are illustrated in the accompanying drawings.

Referring to FIG. 1, an embodiment of a phase-locked loop 100 known to the art is shown. Phase-locked loops 100 known to the art may include an inverter 110, a phase-only detector 120, a phase/frequency detector 130, a charge pump 140, a loop filter 150, and a voltage-controlled oscillator 160. The jitter transfer function of a phase-locked loop 100 as shown in FIG. 1 based on a s-domain linear model may be expressed as:

$$H(s)=[DK_oI_pZ_F(s)]/[2\pi s+DK_oI_pZ_F(s)] \qquad \text{[Equation 1]}$$

where

H(s) is the jitter transfer function;

$K_o$ is the gain of the voltage controlled oscillator 160

$I_p$ is the charge pump 140 current;

$Z_F(s)$ is the loop filter transfer function; and

D is the data transition density

The data transition density may be a measure of the data transition in a given input data pattern. For example, in a data pattern of 1010 the data transition density may be one while the data transition density for 11001100 is one-half. The importance of the data transition density on the jitter transfer function may be seen by applying a commonly used RC loop filter to the jitter transfer function. For the RC loop filter given by R is resistance and C is capicitance:

$$Z_F(s)=R+(1/sC)$$

the jitter transfer function becomes $$H(s)=[DK_oI_pR(s1/RC)]/[2\pi s^2+DK_oI_pRs+(DK_oI_p/C)] \qquad \text{[Equation 2]}$$

The natural frequency $\omega_n$ of a second-order system described by Equation 2 may be $$\omega_n=(DK_oI_p/2\pi C)^{0.5} \qquad \text{[Equation 3]}$$

The loop bandwidth may be the same as the natural frequency when the system is critically damped and the damping factor is equal to 0.707. Thus, from Equation 3 it may be seen that the phase-locked loop bandwidth may be affected by the data transition density. The loop bandwidth's dependence upon the data transition density causes difficulty in optimizing the phase-locked loop's jitter performance with regard to its noise filtering capability. From Equation 3 and a realization that the natural frequency and loop bandwidth have the same value, a change in the data transition density will result in a change in loop bandwidth.

Another factor dependent upon the data transition density for a non-linear phase-locked loop known to the art is the loop gain in the passband. Referring now to FIG. 2, an exemplary graph of loop gain versus jitter frequency for two different data transition densities is shown. The first pattern represented by x is a repeating 1010 data stream which has a transition density of one. The second pattern represented by o is a repeating 01111000111000011100 data stream with a data transition density of 0.3.

As shown in FIG. 2, the phase-locked loop has a wider bandwidth when the 1010 pattern is received, but it is higher than what is expected from Equation 2. The linear model would predict an increase by a factor of $(1/0.3)^{0.5}=1.8$. However, the loop bandwidth actually increases by approximately a factor of 3 due to the nonlinearity of the phase only detector. This may make the optimization of loop performance difficult especially when other loop behavior factors are included such as temperature, supply voltage, and process variations. Further, as shown in FIG. 2 the loop gain in the passband is changed when different data patterns are received. This is also caused by the nonlinearity of the phase only detector. With an approximate 1.5 dB higher loop gain results in a decrease of 7.5% jitter tolerance at 1.25 gigabytes per second.

When the loop gain is data transition density dependent, the static phase error is also a function of transition density. The static phase error is the amount of phase error when there is no noise. The static phase error is a part of the total jitter budget. At lower data rates, the static phase error may be ignored. However, as data rates rise into multi gigabits per second region, then the static phase error becomes nontrivial.

Referring now to FIG. 3, an alternative embodiment 300 of a phase-locked loop is shown. The phase-locked loop 300 as shown in FIG. 3 includes an inverter 310, a phase-only detector 320, a phase/frequency detector 330, a charge pump 340, a loop filter 350, and a voltage-controlled oscillator 360. While the phase-locked loop 300 as shown in FIG. 3 is similar to the embodiment shown in FIG. 1, the voltage-controlled oscillator 360 is different. In the embodiment as shown in FIG. 1, the voltage-controlled oscillator is running at the same frequency as the incoming data rate. This tends to limit the speed in which the phase-locked loop can operate. The voltage-controlled oscillator 360 may be a multi-phase, lower speed voltage-controlled oscillator. An example of this type of oscillator may generate 10 clock phases, each running at 250 megaHertz for a 1.25 Gigabytes per second data rate.

The embodiments of phase-locked loops as shown in FIGS. 1 and 3 are limited in that their jitter transfer function is dependent upon the data transition density. In order to implement a phase-locked loop with a loop bandwidth and passband gain independent of data transition density in accordance with the present invention, several approaches may be implemented.

A first exemplary approach to modify a phase-locked loop with a loop bandwidth and passband gain independent of transition density may be to restrict the number of transitions in a given period. An example of this approach may be to encode the data in a way to allow only one transition in every three-bit period before the bits are transmitted. Under this approach, the receiver may see a constant transition density of 0.3.

When the number of transitions in a given period is restricted, there may be a low bandwidth utilization. For example, an eight-bit 10101010 data stream may be encoded into a twelve-bit 100100100100 data with fifty percent overhead. Also, restricting the number of transitions in a given period may be incompatible with existing standards such as Fibre Channel and Gigabit Ethernet.

Another exemplary approach for modifying a phase-locked loop to obtain a loop bandwidth and passband gain independent of transition density may involve altering a phase-only detector so it responds to only one transition in a given period. An example of responding to only one transition in a given period may be responding to one transition in a three-bit period creating an effective transition density of 0.3 even if a 1010 pattern is received. The ability to implement this type of approach may be difficult unless the phase-only detector can sample m bits in a clock period where m is an integer multiple of three. A complicated phase detector design with floatable pointers pointing to the boundaries of the current three-bit group may be necessary if the detector is sampling m bits in a clock period and m is not an integer multiple of three.

An alternate exemplary approach for modifying a phase-locked loop to obtain a loop bandwidth and passband gain independent of transition density may involve disabling the phase-only detector temporarily after detecting a transition. For example, in the one transition in a three-bit period approach, after a transition has been detected the phase-only detector may be temporarily disabled. This may allow the phase-only detector of the present invention to ignore transitions in the following two-bit times. In FIG. 4, an embodiment of a phase-only detector 400 known to the art is shown. Referring now to FIG. 5, an exemplary embodiment of a phase-only detector 500 of the present invention which may be capable of temporarily disabling itself after a transition has been detected is shown. The embodiment of a phase-only detector 500 of the present invention may be incorporated in a phase-locked loop design with a full speed voltage-controlled oscillator and a multi-phase, low speed voltage-controlled oscillator. Also, other designs may be developed and utilized by one of ordinary skill in the art for temporarily disabling the phase-only detector after a transition has been detected without departing from the scope and spirit of the present invention.

A simulation of a phase-locked loop as shown in FIG. 3 with the phase-only detector 500 as shown in FIG. 5 has been performed. Referring now to FIG. 6, an exemplary graph of the gain versus jitter frequency with the same data patterns utilized in FIG. 2. As shown in FIG. 6, the loop bandwidth and gain in the passband are approximately the same. Hence, the jitter transfer function of the phase-locked loop of the present invention may be essentially independent of incoming data patterns in terms of loop bandwidth and passband gain. This may be advantageous as it may be possible to optimize the phase-locked loop's loop bandwidth in an easier fashion. Also, with an approximately constant low gain in the passband, the phase-locked loop of the present invention may have a 7.5% higher jitter tolerance than a phase-locked loop known to the art.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of optimizing performance in a phase-locked loop clock recovery system, comprising:

(a) receiving an incoming data stream;

(b) making a loop bandwidth of a phase-locked loop independent of said incoming data stream;

(c) making a loop gain of said phase-locked loop independent of said incoming data stream; and (d) recovering an embedded clock signal from said incoming data stream; wherein a noise filtering performance and a jitter tolerance are enhanced by manipulation of said incoming data stream by restricting a quantity of transitions of said incoming data stream in a given period, said receiving of said incoming data stream is effectively a constant transition density.

2. The method as claimed in claim 1, wherein said manipulation of said incoming data includes responding to a single transition of said incoming data stream in a given period.

3. The method as claimed in claim 1, wherein said manipulation of said incoming data stream includes disabling a phase-only detector upon detection of a first transition of said incoming data stream.

4. The method as claimed in claim 3, wherein transitions following said first transition of said incoming data stream are ignored.

5. A method of optimizing performance in a phase-locked loop clock recovery system, comprising:

(a) receiving an incoming data stream;

(b) detecting a transition in said incoming data stream;

(c) disabling a phase-only detector temporarily; and (d) recovering an embedded clock signal from said incoming data stream; wherein at least one of a loop bandwidth property and loop gain property of said phase-locked loop clock recovery system are independent of said incoming data stream, said phase-only detector being temporarily disabled upon detection of a first transition.

6. The method as claimed in claim 5, wherein transitions following said first transition of said incoming data stream are ignored.

7. A phase-locked loop clock recovery system, comprising:

(a) means for receiving an incoming data stream; and (b) means for recovering an embedded clock signal in said incoming data stream, wherein at least one of a loop bandwidth and loop gain of said phase-locked loop clock recovery system is independent of said incoming data stream, wherein said receiving means is capable of restricting a quantity of transitions of said incoming data stream in a given period and capable of manipulating said incoming data stream to produce a constant transition density.

8. The phase-locked loop clock recovery system as claimed in claim 7, wherein said receiving means is capable of responding to a single transition of said incoming data stream in a given period.

9. The phase-locked loop clock recovery system as claimed in claim 7, wherein said receiving means is capable of temporarily disabling a phase-only detector of said receiving means upon detection of a first transition of said incoming data stream.

10. The phase-locked loop clock recovery system as claimed in claim 9, wherein transitions following said first transition of said incoming data stream are ignored.

11. A phase-locked loop clock recovery system, comprising:

(a) means for receiving an incoming data stream;

(b) means for detecting a transition in said incoming data stream;

(c) means for disabling a phase-only detector temporarily; and (d) means for recovering an embedded clock signal from said incoming data stream; wherein at least one of a loop bandwidth property and loop gain property of said phase-locked loop clock recovery system are independent of said incoming data stream, said phase-only detector being temporarily disabled upon detection of a first transition.

12. The phase-locked loop clock recovery system as claimed in claim 1, wherein transitions following said first transition of said incoming data stream are ignored.

* * * * *